(12) United States Patent
Venturini et al.

(10) Patent No.: US 9,700,959 B2
(45) Date of Patent: Jul. 11, 2017

(54) METHOD AND APPARATUS FOR IRRADIATING A SEMICONDUCTOR MATERIAL SURFACE BY LASER ENERGY

(75) Inventors: Julien Venturini, Paris (FR); Bruno Godard, Les Ulis (FR); Cyril Dutems, Colombes (FR); Marc Bucchia, Herblay (FR)

(73) Assignee: LASER SYSTEMS & SOLUTIONS OF EUROPE, Gennevilliers (FR)

( * ) Notice: Subject to any disclaimer, the term of this patent is extended or adjusted under 35 U.S.C. 154(b) by 256 days.

(21) Appl. No.: 13/263,219

(22) PCT Filed: Mar. 29, 2010

(86) PCT No.: PCT/EP2010/054135
§ 371 (c)(1),
(2), (4) Date: Mar. 8, 2012

(87) PCT Pub. No.: WO2010/115763
PCT Pub. Date: Oct. 14, 2010

(65) Prior Publication Data
US 2012/0171876 A1    Jul. 5, 2012

(30) Foreign Application Priority Data
Apr. 7, 2009   (EP) .................................... 09305290

(51) Int. Cl.
*H01L 21/02* (2006.01)
*B23K 26/00* (2014.01)
*H01L 21/268* (2006.01)
*B23K 26/04* (2014.01)
*B23K 26/073* (2006.01)
(Continued)

(52) U.S. Cl.
CPC ...... *B23K 26/0066* (2013.01); *B23K 26/0006* (2013.01); *B23K 26/04* (2013.01); *B23K 26/073* (2013.01); *B23K 26/08* (2013.01); *B23K 26/40* (2013.01); *G03F 7/70383* (2013.01); *H01L 21/02354* (2013.01); *H01L 21/02678* (2013.01); *H01L 21/268* (2013.01);
(Continued)

(58) Field of Classification Search
CPC ............... H01L 23/5258; H01L 21/268; H01L 21/02354; H01L 21/02678
See application file for complete search history.

(56) References Cited

U.S. PATENT DOCUMENTS 5,868,950 A * 2/1999 Noddin ........................... 216/18
6,388,386 B1   5/2002 Kunii et al.
(Continued)

OTHER PUBLICATIONS

International Search Report for PCT/EP2010/054135, Completed by the European Patent Office on Jun. 8, 2010, 3 Pages.

*Primary Examiner* — Bac Au
(74) *Attorney, Agent, or Firm* — Young & Thompson

(57) ABSTRACT

A method for irradiating semiconductor material is provided which includes selecting a region of a semiconductor layer surface, irradiating the region with an excimer laser which has a beam spot size, and adjusting the beam spot size to match the selected region size. Further, an apparatus for irradiating semiconductor material is provided. The apparatus includes an excimer laser for irradiating a selected region of a semiconductor layer surface, the laser has a laser beam spot size, and a system for adjusting the laser beam spot size to match the selected region size.

12 Claims, 6 Drawing Sheets

(51) Int. Cl.
  *B23K 26/08* (2014.01)
  *G03F 7/20* (2006.01)
  *B23K 26/40* (2014.01)
  *H01L 23/525* (2006.01)
  *B23K 101/40* (2006.01)
  *B23K 103/00* (2006.01)

(52) U.S. Cl.
  CPC ...... *B23K 2201/40* (2013.01); *B23K 2203/50* (2015.10); *B23K 2203/56* (2015.10); *H01L 23/5258* (2013.01)

(56) References Cited

U.S. PATENT DOCUMENTS

| | | | |
|---|---|---|---|
| 7,433,568 B2* | 10/2008 | Tanaka | 385/133 |
| 8,148,663 B2* | 4/2012 | Adams et al. | 219/121.75 |
| 2001/0000243 A1 | 4/2001 | Sugano et al. | |
| 2002/0085276 A1* | 7/2002 | Tanitsu | G03F 7/70066 359/432 |
| 2002/0085757 A1* | 7/2002 | Yamada et al. | 382/181 |
| 2002/0197829 A1 | 12/2002 | Noguchi et al. | |
| 2003/0068836 A1* | 4/2003 | Hongo | B23K 26/0648 438/30 |
| 2003/0160263 A1* | 8/2003 | Hiroshima | 257/151 |
| 2004/0224453 A1* | 11/2004 | Hatano et al. | 438/199 |
| 2005/0048684 A1* | 3/2005 | Arai et al. | 438/30 |
| 2005/0142050 A1 | 6/2005 | Jung et al. | |
| 2005/0233594 A1* | 10/2005 | Hiroshima | 438/761 |
| 2005/0247684 A1* | 11/2005 | Tanaka | B23K 26/063 219/121.76 |
| 2005/0266620 A1* | 12/2005 | Hiroshima | 438/151 |
| 2006/0203231 A1* | 9/2006 | Uto | G01N 21/47 356/237.2 |
| 2006/0215142 A1* | 9/2006 | De Jager | G03F 7/70508 355/69 |
| 2009/0121157 A1* | 5/2009 | Moffatt et al. | 250/492.2 |

* cited by examiner

METHOD AND APPARATUS FOR IRRADIATING A SEMICONDUCTOR MATERIAL SURFACE BY LASER ENERGY

CROSS-REFERNCE TO RELATED APPLICATION

This application is the U.S. national phase of PCT Appln. No. PCT/EP2010/054135 filed Mar. 29, 2010 which claims priority to European application 09305290.0 filed Apr. 7, 2009, the disclosures of which are incorporated in their entirety by reference herein.

FIELD OF THE INVENTION

The present invention relates to a method of irradiating a semiconductor material surface by means of a laser. Further, it relates to a laser apparatus for irradiating a semiconductor material surface.

BACKGROUND OF THE INVENTION

Laser irradiation of semiconductor material surfaces is well known for applications such as thermal annealing of amorphous silicon to obtain re-crystallization, and dopant activation. This technique offers significant advantages over a conventional heating process by enabling a very fast heat treatment and shallow depth of the heated region.

A general problem of conventional laser irradiation processes for semiconductor applications is that due to the high energy density required for the thermal process and the low output energy of traditionally available laser sources, the laser spot size is much smaller than the size of a die, also called a chip or device. As a consequence, the laser spot has to step over or scan the die to cover the full die, resulting in several disadvantages As described by Current and Borland (Technologies New Metrology for Annealing of USJ and Thin Films, 16th IEEE International Conference on Advanced Thermal Processing of Semiconductors—RTP2008) and as illustrated in FIG. 1 and FIG. 2, a first disadvantage is that, if the laser spot (b) scans or steps over the die (a), successive laser spots will overlap at some portions (c) of the die, leading to non-uniformities in dopant activation rate or depth and in surface quality.

Another disadvantage is that, in case multiple laser pulses on the same surface area are needed, the laser spots scans or steps over the surface with very high overlap in order to average multiple laser pulses on each point of the processed surface area, resulting in limited production rate and periodic non-uniformities, so called moiré-patterns.

Another general problem is that dies for different types of applications usually have different sizes, and further that in some applications only parts of the die have to be irradiated. It is well known by the skilled person that, in order to be able to process different die sizes or parts of dies with limited overlap, the beam spot is shaped by a variety of masks with different sizes. Since consequently the mask has to be changed and tuned each time another size is needed, manufacturing flexibility is severely limited and downtimes may be significant.

In an attempt to overcome the above drawbacks, WO 01/61407 (Hawryluk et al.) describes a laser irradiation apparatus using a variable aperture stop for defining the size of the exposure field.

A clear drawback however is that, according to Hawryluk et al., the laser light source needed to obtain satisfying uniformity needs to be a solid-state laser with more than 1000 spatial modes, which is not a currently commercially available laser source.

Another example where the beam spot is sized is US 2006/0176920, wherein Park et al. describe a laser irradiation apparatus comprising intensity pattern regulating units having a through, a semi-through and a blocking region for variably regulating the intensity of a strip-shaped laser beam by regulating its length.

Considering the drawbacks of the above laser irradiation processes, there is a clear need for the laser irradiation method and apparatus according to the present invention, which as a first object may provide the ability to process semiconductor material layers obtaining acceptable uniformity within die and within wafer, while keeping acceptable production rate, and manufacturing flexibility.

As second object the present invention may provide a reduction of overlapping effects and attenuation regions.

As another object the present invention may provide the ability to generate a beam with flexible image shape on the material layer surface.

As another object the present invention may provide the ability to irradiate at lower temperatures and maximize the conversion of laser energy into heat.

The present invention meets the above objects by variably matching the laser beam spot size to the selected region size.

SUMMARY OF THE INVENTION

The present invention is directed to a method for irradiating semiconductor material comprising:
- selecting a region of a semiconductor material layer surface, the region having a region size; irradiating the region of the semiconductor material layer surface with an excimer laser having a beam spot size;
- and adjusting the beam spot size;
- characterized in that adjusting the beam spot size comprises variably matching the beam spot size to the selected region size.

Further the present invention is directed to an apparatus for irradiating semiconductor material comprising:
- an excimer laser for irradiating a selected region of a semiconductor layer surface, the laser having a laser beam spot size to the selected region having a region size;
- and a means for adjusting the laser beam spot size;
- characterized in that the means for adjusting the laser beam spot size are adapted for variably matching the laser beam spot size to the selected region size.

DESCRIPTION OF THE INVENTION

A person skilled in the art will understood that the embodiments described below are merely illustrative in accordance with the present invention and not limiting the intended scope of the invention. Other embodiments may also be considered.

According to a first embodiment of the present invention a method for irradiating semiconductor material is provided comprising:

selecting a region of a semiconductor material layer surface, the region having a region size;

irradiating the region of the semiconductor material layer surface with an excimer laser having a beam spot size; and adjusting the beam spot size;

characterized in that adjusting the beam spot size comprises variably matching the beam spot size to the selected region size.

By variably matching the beam spot size to the selected region size, the method may provide acceptable uniformity within die and within wafer due to a reduction of overlapping effects and attenuation regions. Moreover, the method may provide acceptable production rate and manufacturing flexibility by the ability to generate a beam spot with flexible shape and size on the material layer surface.

The semiconductor material layer may be of any material suitable for semiconductor applications such as, but not limited to undoped silicon, doped silicon, implanted silicon, crystalline silicon, amorphous silicon, silicon germanium, germanium nitride, III-V compound semiconductors such as gallium nitride, silicon carbide, and the like.

Figure 5:
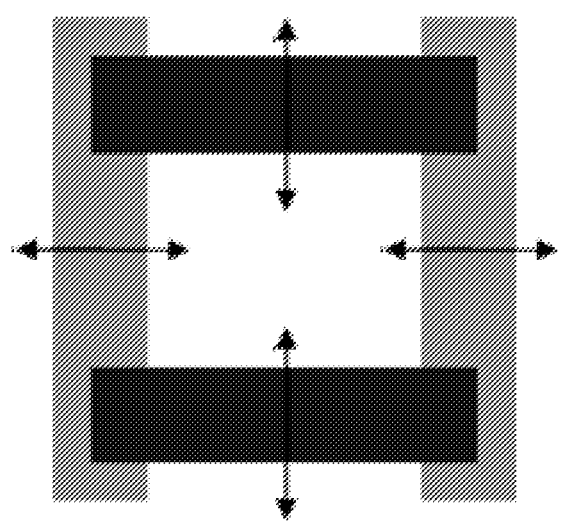
FIG. 5 illustrates a variable aperture.

In an embodiment in accordance with the present invention, matching the beam spot size may be done by varying the size and shape of a variable aperture whose image is formed on the material layer surface. In essence, such aperture is a hole or an opening through which the laser beam passes and which defines the shape and size of the beam spot on the selected region. By mechanically varying this variable aperture, the size and/or shape of the beam spot can be matched to the size ad/or shape of the selected region. Such variable aperture may be equipped with blades which position can be variably adjusted, as illustrated in FIG. 5.

Depending on the beam spot accuracy required, a fine adjustment of the aperture may be needed to correct inaccuracies and to exactly matching the spot size with the selected region. This fine adjustment may be performed by visualizing the beam spot on the material layer surface using a camera, measuring the spot size and adjusting the aperture's opening size and shape. In case of an aperture equipped with blades, the blades positions may be fine-tuned to reach the target spot size with the desired accuracy.

In an alternative embodiment in accordance with the present invention or in combination with a variable aperture, matching the beam spot size may be done by an optical system with variable image magnification. Such optical system is adapted for creating the image of the aperture on the wafer with variable magnification.

Further in accordance with the present invention, the method may comprise alignment of the beam spot in XYZ-direction with respect to the selected region.

Figure 1:
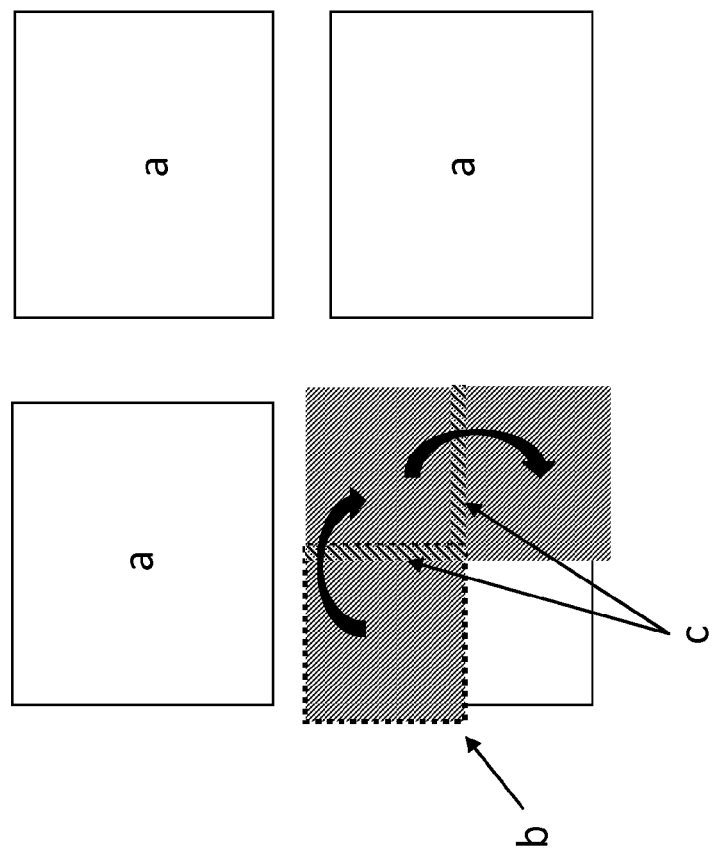
FIG. 1 illustrates a prior art method.
Figure 2:
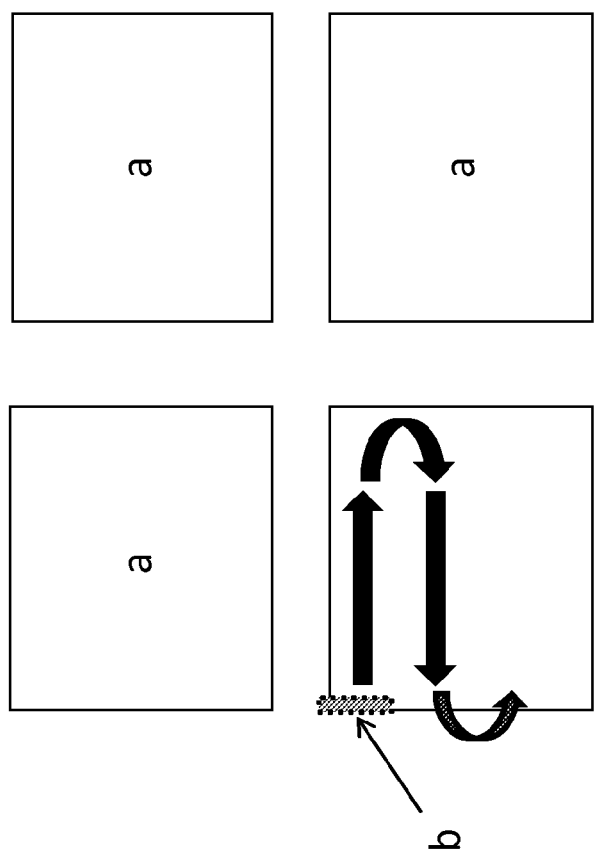
FIG. 2 illustrates another prior art method.
Figure 3:
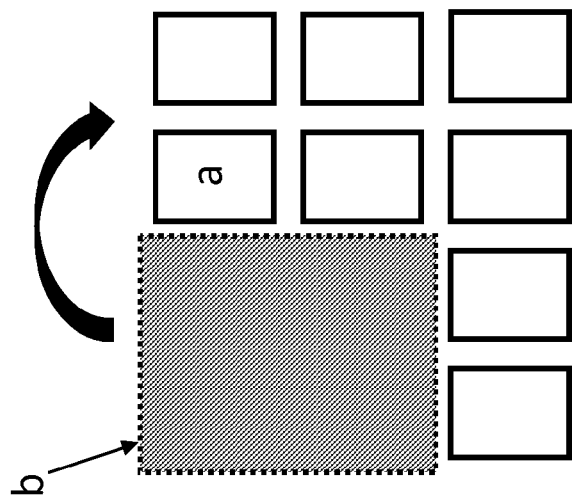
FIG. 3 illustrates a method in accordance with the present invention.
Figure 3:
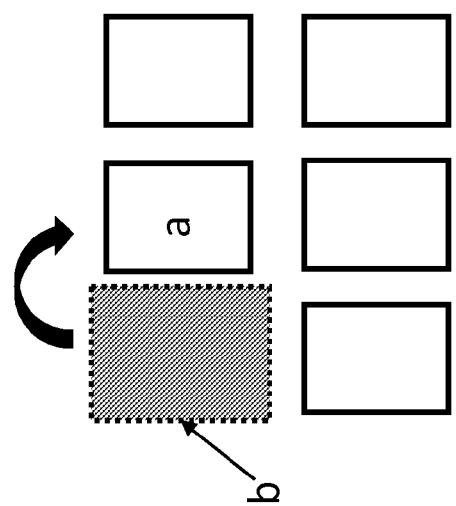

In a preferred embodiment of the present invention and as illustrated in FIG. 3, the selected region may be at least one full die. The full die may be treated by one laser pulse. Also, the die could receive multiple laser pulses, all covering the full die.

Further as also illustrated in FIG. 3, the selected region may cover multiple dies. In FIG. is shown that irradiating one or more full dies may significantly contribute to increased uniform irradiation energy distribution over the die (e) and to reduction of overlapping effects (c), resulting in increased process uniformity.

A method in accordance with the present invention may further comprise homogenizing the laser beam before matching the beam spot size to the selected region size. Homogenizing the laser beam will obviously contribute to increasing process uniformity.

Further in accordance with present invention, an apparatus for irradiating semiconductor material is provided comprising:

an excimer laser for irradiating a selected region of a semiconductor layer surface, the laser having a laser beam spot size to the selected region having a region size;

and a means for adjusting the laser beam spot size;

characterized in that the means for adjusting the laser beam spot size are adapted for variably matching the laser beam spot size to the selected region size.

The excimer laser may be any excimer laser whose wavelength, energy and pulse duration is adapted to the process, preferably a xenon chloride excimer laser.

The wavelength of the excimer laser may be in the range of 190 nm to 480 nm due to the high energy absorption of silicon at those wavelengths, and preferably 308 nm.

The laser energy may be in the range of 5 Joules to 25 Joules. In order to achieve these energies, the laser discharge volume is optimized to typically 10 cm (inter electrodes spacing)×7 to 10 cm (discharge width)×100 to 200 cm (discharge length).

The pulse duration corresponds to an optimum between fast heating for reducing diffusion of dopants and relatively slow cool down for reducing the formation of defects, and may be in the range of 100 ns to 1000 ns, preferably between 100 ns and 300 ns.

In a preferred embodiment, the excimer laser may be adapted to produce a large area output beam of more than 80 $cm^2$, preferably 100 $cm^2$.

In another preferred embodiment, the excimer laser may be adapted to produce a laser beam with an energy density between 1 and 10 $J/cm^2$.

Figure 4:
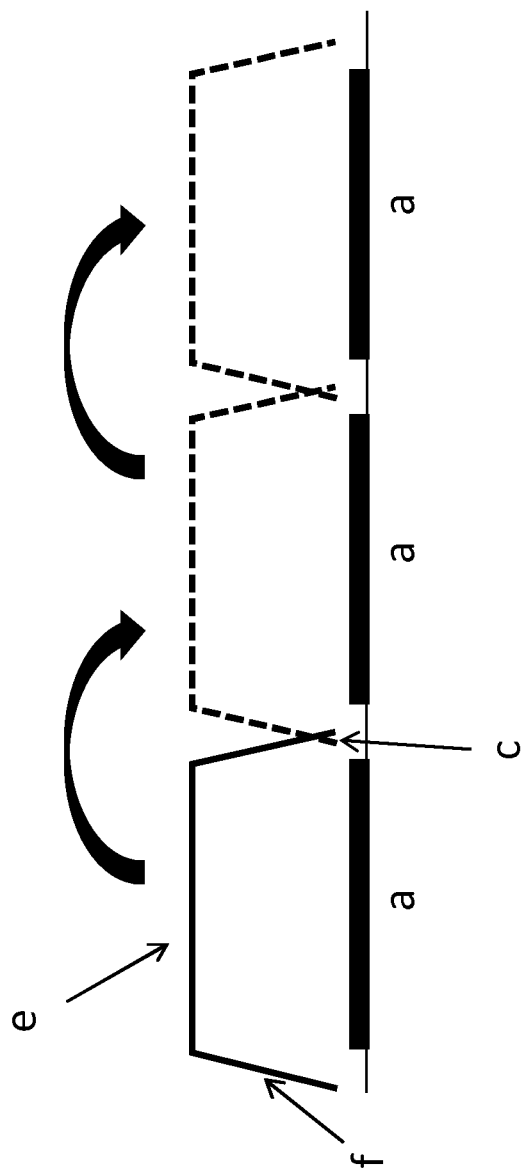
FIG. 4 illustrates a preferred irradiation energy distribution over a full die in accordance with the present invention.

In accordance with the present invention, the means for matching the laser beam spot size may comprise a variable aperture. The variable aperture may not only define the beam spot size and/or shape, but may significantly contribute to obtain sharp image edges (FIG. 4, f) through imaging of this aperture by a high resolution imaging system thereby reducing attenuation regions and overlapping effects.

Figure 6:
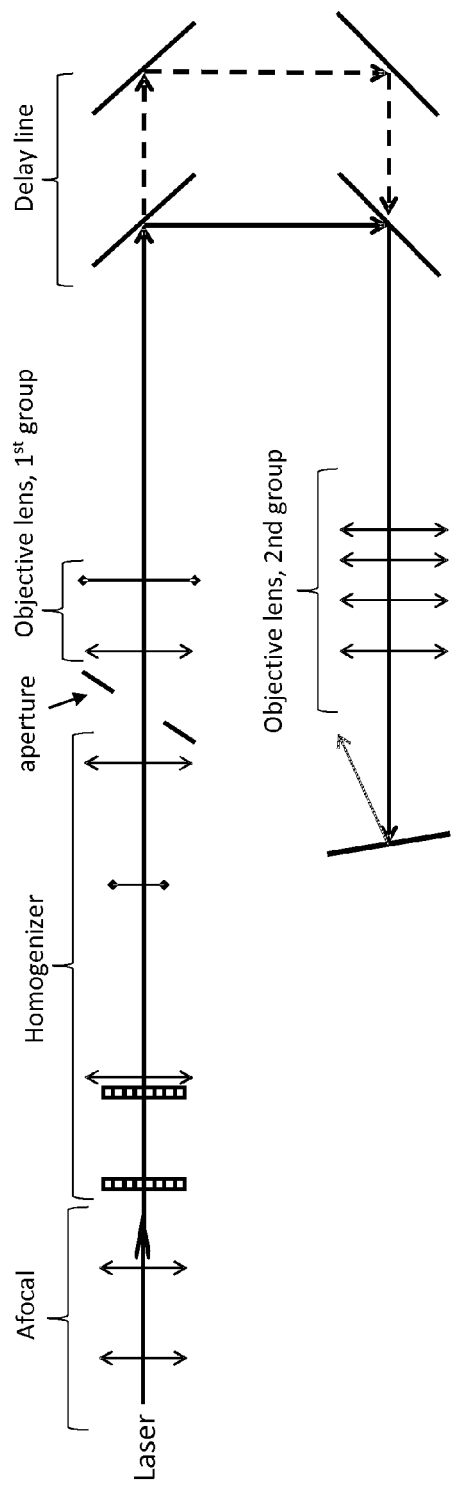
FIG. 6 illustrates an optical system with variable image magnification.

Alternatively in accordance with the present invention, the means for matching the laser beam spot size comprises an optical system with variable image magnification. In such optical system as illustrated in FIG. 6, the distance between a first lens or a first group of lenses (objective lens, $1^{st}$ group) and a second lens or second group of lenses (objective lens, 2nd group) is adjustable by means of a delay line to adjust the magnification of the system (typically from 4× to 8×).

The optical system with variable image magnification may be used in or without combination of a variable aperture.

In an embodiment of the present invention, the beam spot size on the selection region may be adjusted from 1 to 4.5 $cm^2$ in rectangular shape.

An apparatus according to the invention may further comprise means for aligning the beam spot in XYZ-direction with the selected region.

Preferably, the depth of focus may be as long as possible and preferably more than 100 micrometers in order to avoid the need for very accurate, complex and expensive position adjustment along the focus.

The angle of incidence of the laser beam on the selected region may be at an angle (typically 5°) with respect to the plane orthogonal to the semiconductor material layer in order to avoid that the reflected light off the surface is injected back into the optical system.

An apparatus according to the present invention may further comprise a beam homogenizer positioned before the means for adjusting the laser beam spot size.

An apparatus according to the present invention may further comprise a pattern recognition system. Such pattern recognition system may comprise a camera, mechanically linked to a stage for holding the semiconductor material, and positioned above the material layer surface. In a specific embodiment, the image from the camera may be processed to locate several (typically 3) alignment marks that have been etched on the semiconductor material. The alignment marks provide the precise location of the semiconductor material in the coordinate system the apparatus.

The apparatus in accordance with the present invention may be used for making semiconductor material or devices, such as but not limited to CMOS image sensors and 3D memories.

Regarding CMOS image sensors, the method and apparatus of the present invention may be very useful for back side illuminated CMOS image sensors, where light is collected on the back side of the device while the readout/charge collection is performed on the front side. Back side illumination requires back side dopant activation with very good uniformity of activation rate and depth. Furthermore, the activation process has to maintain a very high quality of surface to maintain image quality over the whole sensor. By using the method and apparatus of the present invention it may be possible to irradiate the back side of one or more full sensor by one pulse, thereby avoiding scanning or stepping with overlap and achieving the required sensor uniformity.

EXAMPLE OF A METHOD IN ACCORDANCE WITH THE INVENTION

Step 0: Loading and roughly positioning of the wafer with respect to the beam spot Step 1: Selection of irradiation parameters:

The irradiation parameters are selected based on
  the energy density required on the specific wafer substrate (e.g. 2 J/cm$^2$)
  the dimensions of treated area (XW×YW) on wafer (e.g. 18×12 mm)
  coordinates of the dies to be irradiated on the wafer ((Xi, Yi) from i=1 to N, with N being the number of dies to irradiate) with respect to a reference position.

Step 2: Adjustment of the system magnification:
  Calculation of the magnification (G) of the optical system is done that will create a spot size on the wafer closest to the desired dimensions (XW×YW) on the wafer while having the aperture blades in its fully open position (Xopen=96 mm, Yopen=76 mm). In this example G=Xopen/XW=96/18=5.33.
  The position of the delay line is adjusted to a preset position (determined by a prior calibration), corresponding to the desired magnification, resulting in a spot size on the wafer of 96/5.33×72/5.33=18×13.5 mm. Fine adjustment of the focus of the objective lens groups may be also required.

Step 3: Adjustment of the mask dimension:
  The aperture blades positions are adjusted to achieve the required beam size. In this example, the two vertical blades (adjustment of X) are left in the open position and the two horizontal blades are adjusted to reach Y=12 mm, resulting in a spot size on the wafer of nominally 18×12 mm.
  Fine-tuning of the aperture blades positions.

Step 4: Positioning of the laser spot with respect to the wafer to be treated:
  A pattern recognition step will locate the exact position of 3 alignment marks on the wafer with respect to the wafer stage coordinate system
  The wafer stage is moved to overlay the location of the laser spot with the location of first die to be treated Step 5: Irradiation:
  The laser irradiates the first die with the required energy density. The irradiation energy is controlled by the adjusting the laser charging voltage and using variable attenuators in the beam path.
  The wafer stage is moved to the next die location (Xi, Yi)
  Irradiation and moving the wafer stage is repeated until all dies to be treated are irradiated.

The invention claimed is:

1. A method for irradiating semiconductor material comprising:
  selecting a region of a semiconductor material layer surface, the region having a region size and shape;
  creating on the semiconductor material layer surface, using an optical system with variable image magnification, an image of a mechanically variable aperture comprising movable blades defining a beam spot size and a shape of an excimer laser beam whose size and shape are mechanically variable;
  said image being the closest to the size and shape of the selected region while mechanically variable aperture in its fully open position;
  mechanically varying the size and the shape of the mechanically variable aperture by moving the movable blades for adjusting the laser beam spot size and the shape, so that the laser beam spot matches the size and the shape of the selected region; and
  irradiating the region of the semiconductor material layer surface with the excimer laser beam having the adjusted beam spot size and the adjusted shape.

2. The method according to claim 1, further comprising aligning the beam spot in XYZ-direction with the selected region.

3. The method according to claim 1, further comprising homogenizing the laser beam before matching the beam spot size and the adjusted shape to the selected region size and shape.

4. The method according claim 1, wherein the selected region is one full die.

5. An apparatus for irradiating semiconductor material comprising:
  an excimer laser for irradiating a selected region of a semiconductor material layer surface having a region size and shape, the laser having a laser beam spot size and shape; and
  an optical system with variable image magnification for creating, on the semiconductor material layer surface, an image of a mechanically variable aperture comprising movable blades defining the size and the shape of the laser beam spot, said image being the closest to the size and shape of the selected region while the variable aperture is in its fully open position; and
  means for mechanically varying the size and the shape of the aperture by moving the movable blades for adjusting the size and the shape of the laser beam spot to the selected region size and shape.

6. The apparatus according to claim 5, further comprising means for aligning the beam spot in XYZ-direction with the selected region.

7. The apparatus according to claim 5, further comprising a beam homogenizer positioned before the means for adjusting the laser beam spot size and the laser beam spot shape.

8. Use of an apparatus according to claim 5 for making semiconductor material.

9. The apparatus according to claim 5, wherein the excimer laser is adapted to produce a laser beam with an energy density between 1 and 10 J/cm$^2$.

10. The apparatus according to claim 5, wherein the beam spot size matches one full die.

11. The apparatus of claim 5, wherein the means for aligning the laser beam spot in XYZ-direction comprises a camera positioned above the material layer surface for obtaining an image of the material layer surface.

12. The apparatus of claim 11, further comprising means to process the image to locate plural alignments marks etched on the semiconductor material layer surface.

* * * * *